(12) United States Patent
Haverty et al.

(10) Patent No.: US 9,577,057 B2
(45) Date of Patent: Feb. 21, 2017

(54) SEMICONDUCTOR DEVICE CONTACTS

(71) Applicant: INTEL CORPORATION, Santa Clara, CA (US)

(72) Inventors: Michael G. Haverty, Mountain View, CA (US); Sadasivan Shankar, Cupertino, CA (US); Tahir Ghani, Portland, OR (US); Seongjun Park, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/886,778

(22) Filed: Oct. 19, 2015

(65) Prior Publication Data

US 2016/0043191 A1   Feb. 11, 2016

Related U.S. Application Data

(63) Continuation of application No. 12/978,359, filed on Dec. 23, 2010, now Pat. No. 9,166,004.

(51) Int. Cl.
*H01L 29/76*        (2006.01)
*H01L 29/78*        (2006.01)
(Continued)

(52) U.S. Cl.
CPC ....... *H01L 29/41791* (2013.01); *H01L 23/485* (2013.01); *H01L 29/0895* (2013.01);
(Continued)

(58) Field of Classification Search
CPC ................... H01L 2924/0002; H01L 2924/00;
H01L 23/485; H01L 29/0895; H01L 29/456; H01L 21/283; H01L 21/3205; H01L 23/482; H01L 29/41791; H01L 29/7851; B23C 3/30; Y10T 409/108586
(Continued)

(56) References Cited

U.S. PATENT DOCUMENTS 3,106,489 A   10/1963   Lepselter
3,426,255 A   2/1969   Heywang
(Continued)

FOREIGN PATENT DOCUMENTS

WO      2012/087660 A2    6/2012

OTHER PUBLICATIONS

Hakansson, G., et. al, "Microstructures of TiN Films Grown by Various Physical Vapour Deposition Techniques." Surface and Coatings Technology, vol. 48, 1991, pp. 51-67.*.
(Continued)

*Primary Examiner* — Teresa M Arroyo
(74) *Attorney, Agent, or Firm* — Finch & Maloney PLLC

(57) ABSTRACT

Techniques are disclosed for forming contacts in silicon semiconductor devices. In some embodiments, a transition layer forms a non-reactive interface with the silicon semiconductor contact surface. In some such cases, a conductive material provides the contacts and the material forming a non-reactive interface with the silicon surface. In other cases, a thin semiconducting or insulating layer provides the non-reactive interface with the silicon surface and is coupled to conductive material of the contacts. The techniques can be embodied, for instance, in planar or non-planar (e.g., double-gate and tri-gate FinFETs) transistor devices.

16 Claims, 5 Drawing Sheets

(51) Int. Cl.
  *H01L 21/02* (2006.01)
  *H01L 29/417* (2006.01)
  *H01L 23/485* (2006.01)
  *H01L 29/08* (2006.01)
  *H01L 29/45* (2006.01)
  *H01L 23/482* (2006.01)
  *H01L 21/283* (2006.01)
  *H01L 21/3205* (2006.01)

(52) U.S. Cl.
  CPC ........ *H01L 29/456* (2013.01); *H01L 29/7851* (2013.01); *H01L 21/283* (2013.01); *H01L 21/3205* (2013.01); *H01L 23/482* (2013.01); *H01L 2924/0002* (2013.01)

(58) Field of Classification Search
  USPC .................................. 257/288, 333, 382, 389
  See application file for complete search history.

(56) References Cited

U.S. PATENT DOCUMENTS

| | | | | |
|---|---|---|---|---|
| 4,656,076 | A | * | 4/1987 | Vetanen ............... H01L 29/0843 257/268 |
| 4,894,693 | A | * | 1/1990 | Tigelaar ............. H01L 21/76895 257/311 |
| 5,168,335 | A | | 12/1992 | D'Arrigo et al. |
| 5,292,673 | A | * | 3/1994 | Shinriki ............ H01L 29/66575 257/E21.433 |
| 5,403,763 | A | | 4/1995 | Yamazaki |
| 5,814,862 | A | | 9/1998 | Sung et al. |
| 5,932,929 | A | | 8/1999 | Lui et al. |
| 5,986,301 | A | * | 11/1999 | Fukushima ....... H01L 27/11502 257/295 |
| 6,284,663 | B1 | * | 9/2001 | Alers .................. H01L 21/3105 257/E21.008 |
| 6,417,101 | B2 | * | 7/2002 | Hong ................ H01L 21/76843 257/E21.009 |
| 7,105,430 | B2 | | 9/2006 | Orlowski et al. |
| 2001/0010389 | A1 | | 8/2001 | Forbes et al. |
| 2003/0127696 | A1 | | 7/2003 | Lee |
| 2004/0026687 | A1 | | 2/2004 | Grupp et al. |
| 2005/0023617 | A1 | | 2/2005 | Schoellkopf et al. |
| 2005/0035410 | A1 | | 2/2005 | Yeo et al. |
| 2005/0051855 | A1 | | 3/2005 | Kanegae et al. |
| 2005/0062048 | A1 | | 3/2005 | Hayashi et al. |
| 2005/0269611 | A1 | | 12/2005 | Van Der Sluis et al. |
| 2006/0091474 | A1 | | 5/2006 | Nabatame et al. |
| 2006/0180852 | A1 | | 8/2006 | Kanegae et al. |
| 2006/0244060 | A1 | | 11/2006 | Kapels et al. |
| 2007/0018328 | A1 | * | 1/2007 | Hierlemann .... H01L 21/823807 257/762 |
| 2007/0059930 | A1 | | 3/2007 | Basceri |
| 2007/0290298 | A1 | | 12/2007 | Shastri et al. |
| 2008/0185670 | A1 | * | 8/2008 | Kajiyama ............. H01L 27/228 257/421 |
| 2009/0127657 | A1 | | 5/2009 | Sashida |
| 2010/0187585 | A1 | * | 7/2010 | Ishikawa ................ B82Y 25/00 257/295 |
| 2010/0200899 | A1 | | 8/2010 | Marukame et al. |
| 2010/0224916 | A1 | | 9/2010 | Shimizu et al. |
| 2012/0161321 | A1 | | 6/2012 | Haverty |

OTHER PUBLICATIONS

Kobayashi, Masaharu, et al. "Fermi-Level Depinning in Metal/Ge Schottky Junction and Its Application to Metal Source/Drain Ge NMOSFET." Symposium on VLSI Technology Digest of Technical Papers, 2008, pp. 54-55.*.
Lee, Dong-Kak, et al., "Low Temperature TiN Deposition by ICP-assisted Chemical Vapor Deposition." Surface and Coatings Technology 173-174, 2003, pp. 1234-1237.*.
Lim, Hyun S., et. al, "Atomic Layer Deposition- and Chemical Vapor Deposition-TiN Top Electrode Optimization for the Reliability of Ta2O5 and Al2O3 Metal Insulator Silicon Capacitor for 0.13 µm Technology and Beyond." Jpn. J. Appl. Phys., vol. 40, Part 1, No. 4B,Apr. 2001, pp. 2669-2673.*.
Yamamuka, Mikio et. al, "A Mass Spectrometric Study of Reaction Mechanisms in Chemical Vapor Deposition of (Ba, Sr)TiO3 Films." Jpn. J. Appl. Phys., vol. 36, Part I, No. 4B, Apr. 1997, pp. 2555-2560.*.
Zollweg, Robert J. "X-Ray Lattice Constant of Barium Oxide." Physical Review, vol. 100, No. 2 Oct. 15, 1955, pp. 671-673.*.
International Search Report and Written Opinion received for PCT Patent Application No. PCT/US2011/064604, mailed on Jul. 23, 2012, 11 pages.*.
Office Action for Taiwan Patent Application No. 100146585, mailed on Oct. 9, 2014, 9 pages of English Translation and 10 pages of Office Action.*.
International Preliminary Report on Patentability received for PCT Patent Application No. PCT/US2011/064604, mailed on Jul. 24, 2013, 7 pages.

* cited by examiner

SEMICONDUCTOR DEVICE CONTACTS

RELATED APPLICATION

This application is a continuation of U.S. application Ser. No. 12/978,359 filed Dec. 23, 2010 (now U.S. Pat. No. 9,166,004), which is herein incorporated by reference in its entirety.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal oxide semiconductor (MOS) transistor semiconductor devices, such as those used in a complementary metal oxide semiconductor (CMOS), it is often desired to increase movement of electrons in N-type MOS device (NMOS) and P-type MOS device (PMOS) contact regions. Such increased mobility can be achieved by reducing contact resistance.

At the contact regions of the source and drain a conductive material is deposited on the doped surface providing contacts. The interaction of the conductive material and the doped silicon substrate produce a silicide region. The resulting silicide region produces a Schottky barrier. Conduction of electrons through the Schottky barrier is limited by the barrier height and results in a contact resistance ($R_{contact}$) as shown in FIG. 1. Accordingly, improved methods or structures are needed to overcome the limitations of conventional source/drain contacts.

DETAILED DESCRIPTION

Figure 1:
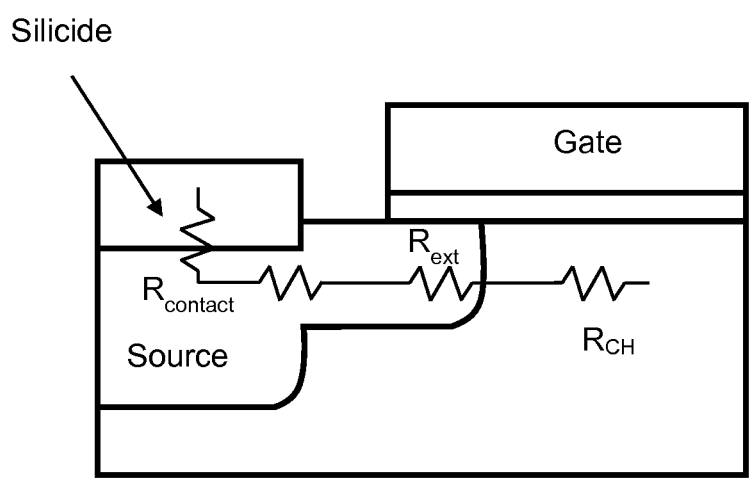
FIG. 1 is a diagram illustrating the resistance components of a conventional MOS device.

Techniques are disclosed for forming a stable non-reactive interface between a conductive contact and a doped silicon source and drain, in accordance with some embodiments of the present invention. The techniques can be used, for example, to form a "non-Schottky" type contact (or non-traditional metal-semiconductor interface) with reduced contact resistance. In some embodiments, this is accomplished by use of conducting material for contacts that is non-reactive with underlying silicon, so as to form a non-reactive interface. In other embodiments, a thin insulating or semiconducting layer is used to form a non-reactive interface with the underlying silicon. In such cases, a conductive material may be coupled to the thin insulating or semiconducting layer to form the contacts. Tunneling through the thin insulating or semiconducting layer allows for a connection while maintaining a non-reactive interface with the contact surface. In some embodiments, the non-reactive interface may provide a reduced contact resistance from lowering of Schottky barrier height to 650 meV or less, and in some such embodiments, to 500 meV or less. The techniques can be embodied, for instance, in any devices that have silicon contact surfaces. The techniques can be embodied, for instance, in planar or non-planar (e.g., double-gate and tri-gate FinFETs) transistor devices.

General Overview

As is known, a metal oxide semiconductor (MOS) transistor may include n-doped or p-doped silicon source and drain regions that produce silicide regions with the conductive material of the contacts. Contacts may also include, for example, interconnects or other electrical junctions including pre- and post-packaging junctions. Conventional processing results in a silicide region producing a materials stack with a Schottky barrier height greater than 500 meV for nMOS devices. Conduction of electrons through such a device is limited by the barrier height and results in a contact resistance ($R_{contact}$ in FIG. 1). This contact resistance may be a significant portion of the source-drain resistance and the overall resistance of the transistor. Due to technology scaling that drives all dimensions of the device down, this source-drain resistance is likely to rise as a percentage of the total device resistance and may become larger than the channel resistance ($R_{CH}$ in FIG. 1). Without a reduction in Schottky barrier height or an alternate solution to increase current, the increase in device resistance may limit future factor to scaling.

Thus, in accordance with an example embodiment of the present invention, a semiconductor contact is provided that allows for reduction in Schottky barrier height. In one specific such embodiment, the contact includes a silicon contact surface (e.g., p-doped, or n-doped, or undoped), and a transition layer coupled to and forming a non-reactive interface with the silicon contact surface. A conducting material may be coupled to or otherwise integral with the transition layer. In one specific such case, the conductive material and the transition layer material are the same material (thus, the transition layer material also effectively forms the contacts). In other example cases, a thin semiconducting or insulating layer provides the transition layer, and a conductive contact material is deposited on or otherwise coupled to the transition layer to form the contacts.

As will be appreciated in light of this disclosure, a non-reactive interface as used herein refers to an interface of silicon (whether doped or not) and transition layer material that does not react, or otherwise minimally reacts, at standard silicidation conditions (e.g., temperatures and pressures) thereby preventing or otherwise inhibiting the formation of silicide. In some embodiments, the fact that such a non-reactive interface may allow for partial or complete silicidation at atypically higher than standard silicidation conditions (e.g., temperature higher than what is typically needed to induce silicidation) should not negate the non-reactive status of that interface, as will be appreciated in light of this disclosure.

Non-Reactive Conductive Material Architecture

Figure 2:
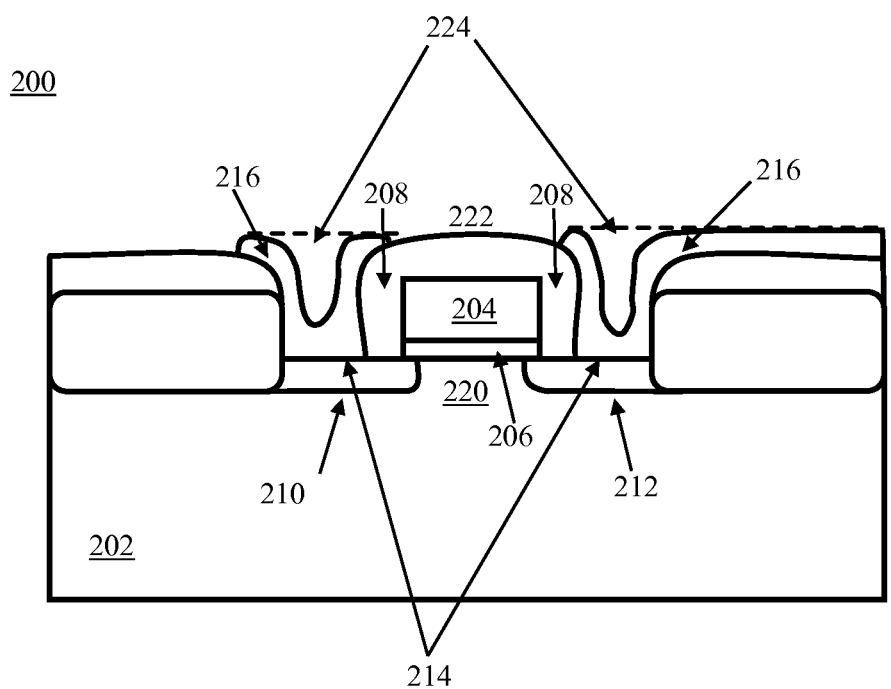
FIG. 2 is an example MOS device that includes source and drain contacts configured in accordance with a conductive material embodiment of the present invention.

FIG. 2 illustrates an example MOS device 200 that includes a source 210 and a drain 212 with a non-reactive contact/interface 214 configured in accordance with an embodiment of the present invention. Rather than using a conductive material for the contacts that results in the formation of a silicide (as shown in FIG. 1) when coming into contact with the n-doped silicon surface of the source 210 and the drain 212, the MOS transistor 200 uses a conductive material 216 that is non-reactive with the n-doped silicon surface of the source 210 and the drain 212. The non-reactive, conductive material 216 allows for conduction of the contacts without the formation of a silicide regions of conventional contacts. The non-reactive interface 214 results in the absence or reduction of a silicide region and thus enables non-Schottky type device behavior. The non-Schottky type device behavior reduces the barrier height resulting in a reduction in contact resistance that may enable overall devices to run at lower power and in some applications with lower current. As will be appreciated, such embodiments may expand circuit design options available in product development cycles, and also open up options for longer battery life products to expand to applications beyond the central processing unit market.

In more detail, FIG. 2 illustrates an exemplary MOS transistor 200 formed on a substrate 202, for example, a p-doped (100) silicon wafer or a silicon film of a silicon on insulator (SOI) substrate or other multi-layered substrate. The source region 210 and the drain region 212 are typically formed by either implanting dopants such as boron or phosphorous into the substrate or by etching the substrate and then epitaxially depositing doped silicon. A gate stack 222 is formed over a channel region 220 of the transistor 200.

As can further be seen, the gate stack 222 includes a gate dielectric layer 206 and a gate electrode 204, and spacers 208. The spacers 208 are formed adjacent to the gate stack 222. In some example cases, and depending on the technology node, the spacers 208 generally create a distance of about 10 to 20 nanometers (nm) between the edges of the gate dielectric layer 206 and the edges of each of the source and drain regions 210/212. An n-type dopant, such as phosphorus, arsenic or other suitable dopant, is introduced into the source region 210 and drain region 212 of MOS device 200. The transistor 200 is then annealed to cause the dopant to diffuse towards the channel region 220. As will be appreciated in light of this disclosure, the techniques provided herein can be applied, for example, to benefit any technology nodes (e.g., 90 nm, 65 nm, 45 nm, 32 nm, 22 nm, 14 nm, and 10 nm transistors, and lower), and the claimed invention is not intended to be limited to any particular such nodes or range of device geometries.

As can be further seen with reference to FIG. 2, this example embodiment includes a conductive material 216 that is non-reactive with the n-doped silicon source 210 and drain 212. The conductive material 216 produces a non-reactive interface 214 with the n-doped silicon. The interface 214 may have no or minimal reaction with the underlying silicon, thereby preventing the formation of silicides. Examples of a conductive material 216 that provide a non-reactive interface 214 in accordance with example embodiments include, but are not limited to, nitrides: lanthanum series nitrides, titanium nitride (TiN), zirconium nitride (ZrN), hafnium nitride (HfN), tantalum nitride (TaN); phosphides: ruthenium phosphide ($Ru_xP_y$), and nickel phosphide ($Ni_xP_y$); carbides: titanium carbide (TiC), zirconium carbide (ZrC), and hafnium carbide (HfC); and conductive oxides: doped zinc oxide (ZnO), titanium mono oxide (TiO), hafnium mono oxide (HfO), and zirconium mono oxide (ZrO), and certain conductive and less reactive carbides such as tantalum carbide (TaC). Additional conductive material 224 may be deposited on top of the non-reactive, conductive material 216 to provide for work function tuning of the transistor 200.

Methodology

Figure 3:
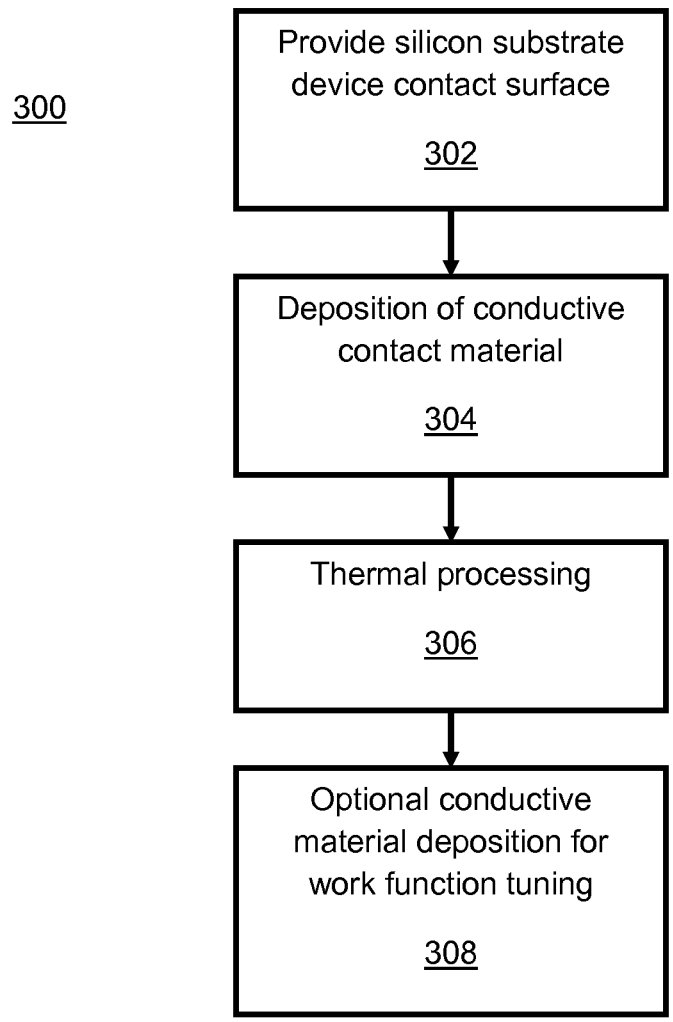
FIG. 3 illustrates a method of building an exemplary MOS device that includes a source and a drain with contacts configured in accordance with an embodiment of the present invention.

FIG. 3 is a method 300 of building an exemplary MOS device such as the one shown in FIG. 2, in accordance with an embodiment of the present invention. As can be seen, the method 300 begins with providing an n-doped silicon semiconductor substrate contact surface (block 302). An example may include, for instance, the source 210 and drain 212 regions of the MOS device 200. The MOS device 200 begins with a silicon substrate upon which a MOS device, such as a MOS transistor, may be formed. The semiconductor substrate may be implemented, for example, with a bulk silicon or a silicon-on-insulator configuration, as previously explained. Although a few examples of materials from which the substrate may be formed are described here, any material that may serve as a silicon foundation upon which a semiconductor device may be built is intended to fall within the spirit and scope of this disclosure.

As previously explained, a gate stack 222 may be constructed on the semiconductor substrate 202, as conventionally done or using any suitable custom techniques. In some example embodiments of the present invention, the gate stack 202 may be formed by depositing and then patterning a gate dielectric layer 206 and a gate electrode layer 204. For instance, in one specific example case, a gate dielectric layer 206 may be blanket deposited onto the semiconductor substrate 202 using conventional deposition processes such as chemical vapor deposition (CVD), atomic layer deposition (ALD), spin-on deposition (SOD), or physical vapor deposition (PVD). Alternate deposition techniques may be used as well. For instance, the gate dielectric 206 layer may be thermally grown. The gate dielectric 206 may be formed, for example, from materials such as silicon dioxide or high-k dielectric materials such as insulators with a dielectric constant above 7. The high-k gate dielectric layer may be between around 5 Angstroms (Å) to around 200 Å thick (e.g., 20 Å to 50 Å). In general, the thickness of the gate dielectric layer 206 should be sufficient to electrically isolate the gate electrode from the neighboring source and drain contacts. In further embodiments, additional processing may be performed on the high-k gate dielectric layer, such as an annealing process to improve the quality of the high-k material. The gate electrode 204 material may be deposited on the gate dielectric layer 206 using similar deposition techniques such as ALD, CVD, or PVD. In some such specific embodiments, the gate electrode 204 material is polysilicon or a metal layer, although other suitable gate electrode materials can be used as well. The gate electrode material, which is typically a sacrificial material that is later removed for a replacement metal gate (RMG) process, has a thickness in the range of 50 Å to 500 Å (e.g., 100 Å), in some example embodiments. A conventional patterning process may then be carried out to etch away portions of the gate electrode layer 204 and the gate dielectric layer 206 to form the gate stack 222.

The source region 210 and drain region 212 may be constructed by introducing an n-type dopant, such as phosphorus or arsenic, into the source region 210 and drain region 212 of MOS device 200. In another example embodiment, the source region 210 and drain region 212 may be constructed by etching away a portion of the substrate 202 that will form the source region 210 and drain region 212 and then depositing n-doped silicon material therein. Once the source and drain regions 210/212 are constructed the method 200 continues with deposition of conductive contact material 216 that forms a non-reactive interface 214 with the source region 210 and drain region 212 (block 304. The previous noted examples of a conductive material 216 are equally applicable here, and various others will be apparent in light of this disclosure. The non-reactive material 216 prevents or otherwise inhibits the formation of silicide compounds from the silicon of the source region 210 and drain region 212. By preventing or minimizing the formation of a silicide layer, the Schottky barrier height is minimized. The Schottky barrier is a rectifying barrier produced by an electrical conduction across a metal and semiconductor boundary. The scale of the Schottky barrier height is related to the mismatch in the energy position of the majority carrier band edge of the semiconductor and the metal Fermi level across the metal semiconductor junction. In a metal and n-type semiconductor junction, the Schottky barrier height is the difference between the conduction band minimum and the Fermi level. The non-reactive, conductive material 216 may be selected by its favorable electronic band structure and properties as well as its thermodynamic ability to remain stable when in contact with n-doped silicon. The surface may be required to be kept clean before the deposition of the contact layer.

With further reference to the example embodiment of FIG. 3, the method 300 continues with the additional thermal processing to form contacts or aid in migration of dopants (block 306). Since the conductive and non-reactive material 216 forms a non-reactive interface, additional mixing at the interface may not present an issue. Additionally, deposition of conductive material 224, for example, but not limited to, aluminum or titanium, may be used for various contacts or for work function tuning of the MOS device 200 (block 308).

The resulting material stack of this example embodiment may provide contacts with the following estimated Schottky barrier height of Table 1. These are representative of the barrier height and other suggested materials herein may be expected to be close to these values.

TABLE 1

| Options (n-doped => 4 to 7*10^20 cm^-3) | | Estimated Barrier Height (meV) |
| --- | --- | --- |
| Conducting layers | TiN | 480 |
| | TaC | 100 to 250 |
| | TiC | 200 |

Non-Reactive Semiconducting or Insulating Material Architecture

Figure 4:
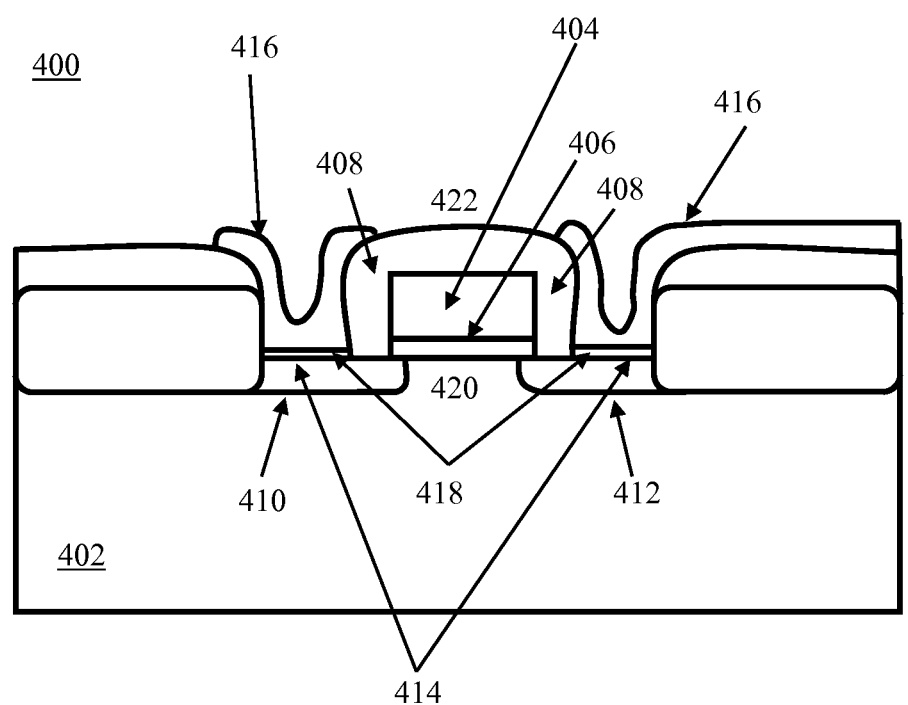
FIG. 4 illustrates an example MOS device that includes a source and a drain with contacts configured in accordance with an insulating/semiconducting material embodiment of the present invention.

FIG. 4 illustrates an example MOS device 400 that includes a source 410 and a drain 412 with a non-reactive contact/interface 414 configured in accordance with an embodiment of the present invention. Rather than using a reactive conductive material for the contacts that results in the formation of a silicide (as shown in FIG. 1) when coming into contact with the doped silicon surface of the source 410 and the drain 412, the MOS transistor 400 uses a thin layer of insulating or semiconducting material 418 that is non-reactive with the doped silicon surface of the source 410 and the drain 412. The non-reactive thin layer of insulating or semiconducting material 418 allows for conduction via tunnel junction by the contacts without the formation of a silicide region of conventional contacts. The non-reactive interface 414 results in the absence or reduction of a silicide region, thereby enabling a "non-Schottky" type device behavior at the semiconductor interface. The non-Schottky type device behavior reduces the barrier height resulting in a reduction in contact resistance that may enable overall devices to run at lower power and in some applications with lower current. Embodiments may expand circuit design options available in product development cycles and may also open up options for longer battery life products to expand to applications beyond the central processing unit market.

In more detail, FIG. 4 illustrates an exemplary MOS transistor 400 formed on a substrate 402, for example, a (100) silicon wafer or a silicon film of a silicon on insulator (SOI) substrate or other multi-layered substrate. In the case of a NMOS transistor the substrate 402 may be p-doped, and in the case of a PMOS transistor the substrate 402 may be n-doped. The source region 410 and the drain region 412 are typically formed by either implanting dopants into the substrate or by etching the substrate and then epitaxially depositing doped silicon, although other suitable formation techniques may be used. The source region 410 and the drain region 412 are doped opposite the substrate 402. A gate stack 422 is formed over a channel region 420 of the transistor 400. As can further be seen, the gate stack 422 includes a gate dielectric layer 406 and a gate electrode 404, and spacers 408. The spacers 408 are formed adjacent to the gate stack 422. As is known, the spacers 408 generally create a distance of about 10 to 20 nanometers (nm) between the edges of the gate dielectric layer 406 and the edges of each of the source and drain regions 410/412. An n-type dopant, such as phosphorus or arsenic, is introduced into the source region 410 and drain region 412 of NMOS device 400. The transistor 400 is then annealed to cause the dopant to diffuse towards the channel region 420.

As can be further seen, the transistor 400 includes an insulating or semiconducting material 418 that is non-reactive with the doped silicon source 410 and drain 412. The insulating or semiconducting material 418 produces a non-reactive interface 414 with the doped silicon. The non-reactive interface 414 may have no or minimal reaction with the silicon thereby preventing the formation of silicides. Examples of an insulating or semiconducting material 418 that can be used to provide a non-reactive interface 414 for n-doped silicon may include, but are not limited to, strontium oxide (SrO), barium sulfide (BaS), barium oxide (BaO), tantalum pentoxide ($Ta_2O_5$), zinc sulfide (ZnS), strontium sulfide (SrS), strontium titanate ($SrTiO_3$), titanium dioxide ($TiO_2$), tantalum nitride ($Ta_3N_5$), and barium titanate ($BaTiO_3$). Examples of an insulating or semiconducting material 418 that can be used to provide a non-reactive interface 414 for p-doped silicon may include, but are not limited to, strontium sulfide (SrS), zinc oxide (ZnO), and strontium oxide ($SrO_2$).

Additional conductive contact material 416 may be deposited on top of the non-reactive, insulating or semiconducting material 418. The insulating or semiconducting material 418 may be deposited in a thin enough layer to allow tunnel junctions to form between the conductive contact material 416 and the source and drain regions 410/412. In some example embodiments, the insulating or semiconducting material 418 may be, for example, less than 5 nm. In one such specific embodiment, the insulating or semiconducting material 418 is less than 2 nanometers thick (e.g., 0.1 to 1.0 nm thick). As will be appreciated, the thickness of the layer 418 may be designed and selected based on the properties of the insulating or semiconducting material, conductive contact material, and/or desired electrical properties of the MOS transistor 400. The additional conductive contact material 416 may also provide for work function tuning of the transistor 400.

Methodology

Figure 5:
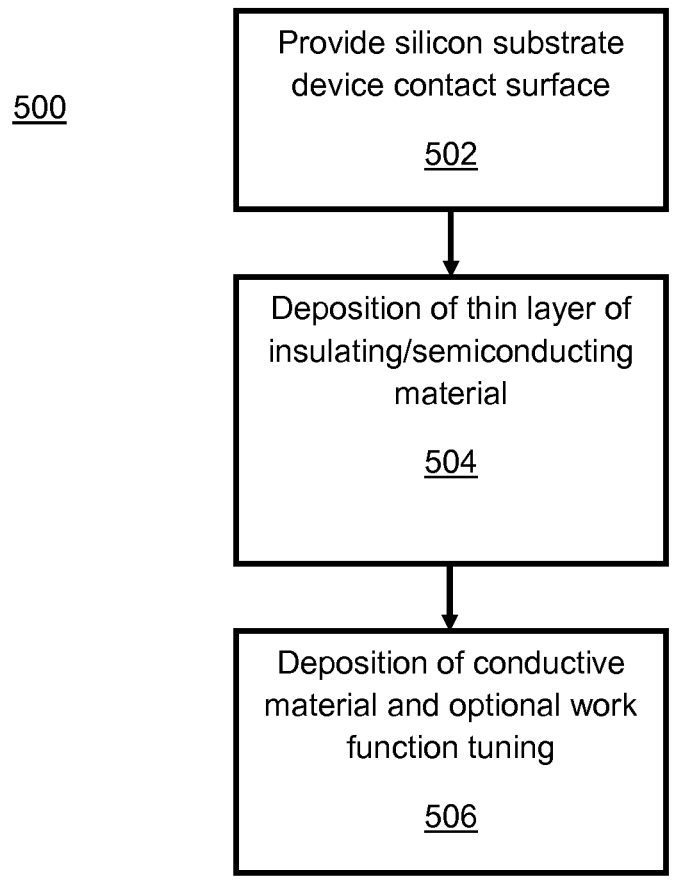
FIG. 5 illustrates a method of building an exemplary MOS that includes a source and a drain with contacts configured in accordance with an embodiment of the present invention.

FIG. 5 is a method 500 of building an exemplary MOS device such as the one shown in FIG. 4, in accordance with an embodiment of the present invention. As can be seen, the method 500 begins with providing a doped silicon semiconductor substrate contact surface (block 502). An example may include the source 410 and drain 412 regions of the MOS device 400, which are formed in a silicon substrate in this example. The semiconductor substrate may be implemented, for example, with a bulk silicon or a silicon-on-insulator configuration. Although a few examples of materials from which the substrate may be formed are described here, any material that may serve as a silicon foundation upon which a semiconductor device may be built is intended to fall within the spirit and scope of this disclosure.

As previously explained, a gate stack 422 may be constructed on the semiconductor substrate 402 as conventionally done or using any suitable custom techniques. In some embodiments of the present invention, the gate stack 402 may be formed by depositing and then patterning a gate dielectric layer 406 and a gate electrode layer 404. For instance, in one example case, a gate dielectric layer 406 may be blanket deposited onto the semiconductor substrate 402 using conventional deposition processes such as CVD, ALD, SOD, or PVD. Alternate deposition techniques may be used as well. For instance, the gate dielectric 406 layer may be thermally grown. The gate dielectric 406 may be formed, for example, from materials such as silicon dioxide or high-k dielectric materials. The previously noted high-k gate dielectric materials are equally applicable here. In some specific example embodiments, the high-k gate dielectric layer may be between around 5 Å to around 200 Å thick (e.g., 20 Å to 50 Å). In general, the thickness of the gate dielectric layer 406 should be sufficient to electrically isolate the gate electrode from the neighboring source and drain contacts. In further embodiments, additional processing may be performed on the high-k gate dielectric layer, such as an annealing process to improve the quality of the high-k material. Next, a gate electrode 404 material may be deposited on the gate dielectric layer 406 using similar deposition techniques such as ALD, CVD, or PVD. In some such specific embodiments, the gate electrode 404 material is polysilicon or a metal layer, although other suitable gate electrode materials can be used as well. The gate electrode 404 material, which is typically a sacrificial material that is later removed for a replacement metal gate (RMG) process, has a thickness in the range of 50 Å to 500 Å (e.g., 100 Å), in some example embodiments. A conventional patterning process may then be carried out to etch away portions of the gate electrode layer 404 and the gate dielectric layer 406 to form the gate stack 422.

The source region 410 and drain region 412 may be constructed by introducing an n-type dopant, such as phosphorus or arsenic, into the source region 410 and drain region 412 of NMOS device and a p-type dopant into the source region 410 and drain region 412 of PMOS device. In another example, the source region 410 and drain region 412 may be constructed by etching away a portion of the substrate 402 that will form the source region 410 and drain region 412 and then depositing doped silicon material therein. Once the source and drain regions 410/412 are constructed, and with further reference to FIG. 5, the method 500 continues with deposition of non-reactive insulating or semiconducting material 418 that forms a non-reactive interface 414 with the source region 410 and drain region 412 (block 504). The previous discussion with respect to examples of semiconducting or insulating material 418 that provide a non-reactive interface 414 with n-doped and p-doped silicon is equally applicable here. The non-reactive material 418 prevents or otherwise inhibits the formation of silicide compounds from the silicon of the source region 410 and drain region 412. By preventing or minimizing the formation of a silicide layer, the Schottky barrier height is reduced and/or minimized. The non-reactive, insulating or semiconducting material 418 may be selected by its favorable electronic band structure and properties as well as its thermodynamic ability to remain stable when in contact with doped silicon.

The example method 500 continues with the additional conductive material 416 to form contacts (block 506). In this configuration, note that the additional conductive material 416 may be reactive with silicon. However, the insulating or semiconducting material 418 forms a non-reactive interface and separates the reactive, conductive material 416 to prevent additional mixing at the interface. The additional conductive material 416 may include, for example, but not limited to, deposition of aluminum or titanium. The conductive material 416 may also be used for work function tuning of the MOS device 400. The resulting material stack for n-doped silicon contacts of this example embodiment may provide contacts with the following estimated Schottky barrier height of Table 2.

TABLE 2

| Options (n-doped => 4 to 7*10^20 cm^-3) | | Estimated Barrier Height (meV) |
|---|---|---|
| Semiconducting or Insulating layers | SrO | 0 to 400 |
| | BaS | ~0 |
| | BaO | 400 |
| | Ta$_2$O$_5$ | 200 to 400 |
| | ZnS | 0 to 200 |
| | SrS | 100 to 200 |
| | SrTiO$_3$ | 160 |
| | TiO$_2$ | 0 to 400 |
| | Ta$_3$N$_5$ | 200 |
| | BaTiO$_3$ | 0 |

The resulting material stack for p-doped silicon contacts of this example embodiment may provide contacts with the following estimated Schottky barrier height of Table 3.

TABLE 3

| Options (p-doped => 4 to 7*10^20 cm^-3) | | Estimated pMOS Barrier Height (meV) |
|---|---|---|
| Semiconducting or Insulating layers | SrS | 200 to 300 |
| | ZnO | 400 |
| | SrO$_2$ | 0 to 400 |

Table 4 shows simulation data of electron transport simulations that show that contact structures configured in accordance with some embodiments of the present invention can offer improved current performance relative to conventional contact structures. The TiN contact identified in Table 2 to have a reduced Schottky barrier height of 480 meV results in an increased current over the current state of the art.

TABLE 4

| | Normalized Current (to Max +/−0.1 V) | | |
|---|---|---|---|
| | Maximum within +/−0.1 V | Maximum within +/−0.5 V | Maximum within +/−1 V |
| Si/Current State of the art | 1 | 1568 | 2212 |
| Si/TiN | 1340 | 3665 | 8068 |

Numerous embodiments and configurations will be apparent in light of this disclosure. For instance, one example embodiment of the present invention provides a semiconductor contact. The contact includes a silicon contact surface, a transition layer coupled to and forming a non-reactive interface with the silicon contact surface, and a conducting material. In one such case, the conducting material comprises the transition layer and is selected from a group consisting of nitrides: lanthanum series nitrides, titanium nitride (TiN), zirconium nitride (ZrN), hafnium nitride (HfN), tantalum nitride (TaN); phosphides: ruthenium phosphide ($Ru_xP_y$), nickel phosphide ($Ni_xP_y$); carbides: titanium carbide (TiC), zirconium carbide (ZrC), hafnium carbide (HfC); conductive oxides: doped zinc oxide (ZnO), titanium mono oxide (TiO), hafnium mono oxide (HfO), zirconium mono oxide (ZrO), and certain conductive and less reactive carbides such as tantalum carbide (TaC). In another such case, the conducting material is coupled to the transition layer, and the transition layer is selected from a group consisting of strontium oxide (SrO), barium sulfide (BaS), barium oxide (BaO), tantalum pentoxide ($Ta_2O_5$), zinc sulfide (ZnS), strontium sulfide (SrS), strontium titanate ($SrTiO_3$), titanium dioxide ($TiO_2$), tantalum nitride ($Ta_3N_5$), barium titanate ($BaTiO_3$), zinc oxide (ZnO), and/or strontium oxide ($SrO_2$). In another such case, the conducting material is coupled to the transition layer, and the transition layer is selected from a group consisting of $BaTiO_3$ and $SrTiO_3$. In another such case, the conducting material is coupled to the transition layer, and the transition layer is selected from a group consisting of strontium sulfide (SrS), zinc oxide (ZnO), and strontium oxide ($SrO_2$). In another such case, the transition layer is less than two nanometers thick. In another such case, the transition layer provides a tunneling junction between the silicon contact surface and the conducting material. In another such case, the contact has a barrier height lower than 500 meV. In another such case, the silicon contact surface is n-doped silicon, although in other embodiments the silicon contact surface may be p-doped or undoped silicon. In another such case, the contact includes a layer of elemental metal (e.g., to provide work function tuning) In one specific such case, the layer of elemental metal comprises titanium (Ti) or aluminum (Al) or other metals with low work function including the conducting layers mentioned above. In another such case, the contact does not include any silicide.

Another embodiment of the present invention provides a semiconductor contact. In this example case, the contact includes a doped silicon contact surface, a transition layer coupled to and forming a non-reactive interface with the doped silicon contact surface, wherein the silicon contact surface does not form a silicide with the transition layer. The contact further includes a conducting material deposited onto the transition layer, wherein the transition layer provides a tunneling junction between the silicon contact surface and the conducting material. In one such case, the transition layer is selected from a group consisting of strontium oxide (SrO), barium sulfide (BaS), barium oxide (BaO), tantalum pentoxide ($Ta_2O_5$), zinc sulfide (ZnS), strontium sulfide (SrS), strontium titanate ($SrTiO_3$), titanium dioxide ($TiO_2$), tantalum nitride ($Ta_3N_5$), barium titanate ($BaTiO_3$), zinc oxide (ZnO), and/or strontium oxide ($SrO_2$). In another such case, the transition layer is less than two nanometers thick. In another such case, the contact has a barrier height lower than 500 meV. In another such case, the doped silicon contact surface is n-doped (in other cases, it is p-doped).

Another embodiment of the present invention provides a method for forming a semiconductor contact. The method includes providing a silicon contact surface, and depositing a transition layer on the silicon contact surface to form a non-reactive interface with the silicon contact surface, thereby inhibiting silicide formation in the contact. In one such embodiment, the method further includes depositing a layer of elemental metal. In another such embodiment, the transition layer is less than two nanometers thick and comprises a semiconducting or insulating material, and the method further comprises depositing a conductive material contact on the transition layer. In another such embodiment, the transition layer comprises a conductive material.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor device comprising:
   a substrate having a channel region therein;
   a gate dielectric on the channel region;
   a gate electrode on the gate dielectric;
   doped silicon source and drain regions at least one of in and on the substrate and adjacent the channel region such that the channel region is between the silicon source and drain regions;
   a transition layer in contact with the silicon source and drain regions, wherein the transition layer is an insulator or semiconducting material and includes no silicide region on the silicon source and drain regions; and
   a conducting material in contact with and distinct from the transition layer;
   wherein the transition layer has a thickness of 5 nanometers or less, such that the distance between the conducting material and the silicon source and drain regions is 5 nanometers or less.

2. The device of claim 1, wherein the substrate is a p-doped substrate and the silicon source and drain regions are n-doped silicon, and the transition layer is selected from a group consisting of strontium oxide (SrO), barium sulfide (BaS), barium oxide (BaO), tantalum pentoxide ($Ta_2O_5$), zinc sulfide (ZnS), strontium sulfide (SrS), strontium titanate ($SrTiO_3$), titanium dioxide ($TiO_2$), tantalum nitride ($Ta_3N_5$), and barium titanate ($BaTiO_3$).

3. The device of claim 2, wherein the transition layer is selected from a group consisting of strontium titanate ($SrTiO_3$) and barium titanate ($BaTiO_3$).

4. The device of claim 1, wherein the thickness of the transition layer is less than two nanometers thick.

5. The device of claim 1, wherein the substrate is an n-doped substrate and the silicon source and drain regions are p-doped silicon, and the transition layer is selected from a group consisting of strontium sulfide (SrS), zinc oxide (ZnO), and strontium oxide ($SrO_2$).

6. The device of claim 5, wherein the thickness of the transition layer is less than two nanometers thick.

7. The device of claim 1, wherein the channel region and the source and drain regions are each formed at least one of in and on a silicon fin extending from the substrate.

8. The device of claim 1, wherein the conducting material is reactive with silicon.

9. The device of claim 1, wherein the conducting material includes aluminum.

10. The device of claim 9, wherein the thickness of the transition layer is less than two nanometers thick.

11. The device of claim 1, wherein the conducting material includes titanium.

12. The device of claim 11, wherein the thickness of the transition layer is less than two nanometers thick.

13. The device of claim 1, wherein the channel region is on two sides of a fin extending from the substrate, such that the gate electrode is a double-gate FinFET.

14. The device of claim 13, wherein the thickness of the transition layer is less than two nanometers thick.

15. The device of claim 1, wherein the channel region is on three sides of a fin extending from the substrate, such that the gate electrode is a tri-gate FinFET.

16. The device of claim 15, wherein the thickness of the transition layer is less than two nanometers thick.

* * * * *